US012738467B2

(12) United States Patent
Vaez-Iravani et al.

(10) Patent No.: US 12,738,467 B2
(45) Date of Patent: Sep. 15, 2026

(54) REAL-TIME DETECTION OF PARTICULATE MATTER DURING DEPOSITION CHAMBER MANUFACTURING

(71) Applicant: Applied Materials, Inc., Santa Clara, CA (US)

(72) Inventors: Mehdi Vaez-Iravani, Los Gatos, CA (US); Todd J. Egan, Fremont, CA (US); Kyle Ross Tantiwong, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/666,251

(22) Filed: May 16, 2024

(65) Prior Publication Data

US 2024/0304430 A1 Sep. 12, 2024

Related U.S. Application Data

(62) Division of application No. 16/946,348, filed on Jun. 17, 2020, now Pat. No. 12,002,665.
(Continued)

(51) Int. Cl.
*H01J 37/32* (2006.01)
*C23C 14/34* (2006.01)
(Continued)

(52) U.S. Cl.
CPC ........ *H01J 37/32972* (2013.01); *C23C 14/34* (2013.01); *C23C 14/54* (2013.01);
(Continued)

(58) Field of Classification Search
CPC ........... H01J 37/32972; H01J 37/32477; H01J 37/3476; H01J 2237/3321; C23C 14/34;
(Continued)

(56) References Cited

U.S. PATENT DOCUMENTS 4,596,036 A 6/1986 Norgren et al.
4,794,086 A 12/1988 Kasper et al.
(Continued)

FOREIGN PATENT DOCUMENTS

CN 1714287 A * 12/2005 ......... G01N 15/0227
CN 1769518 A 5/2006
(Continued)

*Primary Examiner* — Mohamed K Amara
(74) *Attorney, Agent, or Firm* — Lowenstein Sandler LLP

(57) ABSTRACT

Implementations disclosed describe a system that includes a deposition chamber, a light source to produce an incident beam of light, wherein the incident beam of light is to illuminate a region of the deposition chamber, and a camera to collect a scattered light originating from the illuminated region of the deposition chamber, wherein the scattered light is to be produced upon interaction of the first incident beam of light with particles inside the illuminated region of the deposition chamber. The described system may optionally have a processing device, coupled to the camera, to generate scattering data for a plurality of locations of the illuminated region, wherein the scattering data for each location comprises intensity of the scattered light originating from this location.

20 Claims, 9 Drawing Sheets

Related U.S. Application Data

(60) Provisional application No. 62/869,480, filed on Jul. 1, 2019.

(51) Int. Cl.
*C23C 14/54* (2006.01)
*C23C 16/44* (2006.01)
*C23C 16/52* (2006.01)
*G01N 21/01* (2006.01)
*H01J 37/34* (2006.01)

(52) U.S. Cl.
CPC .......... *C23C 16/4401* (2013.01); *C23C 16/52* (2013.01); *G01N 21/01* (2013.01); *H01J 37/32477* (2013.01); *H01J 37/3476* (2013.01); *H01J 2237/3321* (2013.01)

(58) Field of Classification Search
CPC ..... C23C 14/54; C23C 16/4401; C23C 16/52; G01N 21/01; G01N 2015/1486; G01N 2015/1493; G01N 15/1433; G01N 2015/0238; G01N 15/0227; G01N 15/075; G01N 15/1459; G01N 15/0211; G01N 15/06; G01N 2015/0222; H01L 22/12; H01L 22/26
See application file for complete search history.

(56) References Cited

U.S. PATENT DOCUMENTS 4,871,251 A 10/1989 Preikschat et al.
4,885,473 A * 12/1989 Shofner .................... G01P 5/26 356/339
5,192,870 A 3/1993 Batchelder et al.
5,255,089 A 10/1993 Dybas et al.
5,467,189 A 11/1995 Kreikebaum et al.
5,515,164 A 5/1996 Kreikebaum et al.
5,622,567 A * 4/1997 Kojima ............... C23C 14/3471 427/596
5,731,875 A 3/1998 Chandler et al.
5,767,967 A 6/1998 Yufa
5,784,160 A 7/1998 Naqwi
5,943,130 A 8/1999 Bonin et al.
5,946,091 A 8/1999 Yufa
6,115,120 A 9/2000 Moriya et al.
6,355,570 B1 3/2002 Nakata et al.
6,603,542 B1 * 8/2003 Chase .................. G01N 21/956 356/237.4
6,710,878 B1 3/2004 Dean et al.
6,778,272 B2 8/2004 Nakano et al.
6,825,437 B2 11/2004 Nakano et al.
7,053,783 B2 5/2006 Hamburger et al.
8,477,307 B1 * 7/2013 Yufa .................. G01N 15/1459 356/337
8,958,070 B2 * 2/2015 Wang ..................... G01N 21/00 356/432
9,627,485 B2 * 4/2017 Zhou ....................... C30B 25/10
9,736,930 B2 * 8/2017 Yang .................... H05K 1/0283
9,857,287 B2 1/2018 Dittrich et al.
10,008,370 B2 6/2018 Ohmori et al.
10,161,866 B2 * 12/2018 Knox ..................... G08B 25/10
10,261,012 B2 * 4/2019 Wagner ................ G01N 33/487
10,705,001 B2 7/2020 Bachalo et al.
10,900,894 B2 1/2021 Kaye et al.
10,976,674 B2 4/2021 Shih et al.
2003/0076494 A1 4/2003 Bonin et al.
2003/0223063 A1 12/2003 Hill et al.
2004/0104681 A1 6/2004 Mitrovic
2004/0255853 A1 * 12/2004 Ma .......................... C23C 16/52 118/712
2005/0268694 A1 12/2005 Moriya et al.
2006/0132769 A1 6/2006 Iwa et al.
2007/0165225 A1 7/2007 Trainer
2010/0119839 A1 5/2010 Chen
2011/0249263 A1 10/2011 Beck et al.
2012/0026464 A1 2/2012 Berger et al.
2012/0044493 A1 2/2012 Smart et al.
2012/0273255 A1 * 11/2012 Hemond ................. C23C 30/00 977/932
2013/0093874 A1 4/2013 Hulsken
2013/0187097 A1 * 7/2013 Hong ..................... B82Y 40/00 252/502
2014/0004559 A1 1/2014 Hill et al.
2014/0014848 A1 1/2014 Hatakeyama et al.
2014/0261998 A1 * 9/2014 Veerasamy ............. C23C 16/26 156/247
2015/0179922 A1 * 6/2015 Kim ..................... H10N 30/853 29/25.35
2015/0355106 A1 12/2015 Horn
2016/0177449 A1 6/2016 Ohmori et al.
2016/0225991 A1 * 8/2016 Schwab .................. C23C 16/26
2018/0226169 A1 * 8/2018 Son ....................... H01M 4/386
2018/0346679 A1 * 12/2018 Shishkin .................. H01B 1/24
2018/0356328 A1 12/2018 Kimura
2020/0249148 A1 8/2020 Tomaras et al.
2020/0289853 A1 9/2020 Friedman
2022/0018754 A1 1/2022 Lychagov et al.
2023/0011748 A1 * 1/2023 Vaez-Iravani ...... G01B 11/0633
2023/0105279 A1 * 4/2023 Cheng ............... H01J 37/32981 427/8

FOREIGN PATENT DOCUMENTS

CN 1776400 A 5/2006
CN 101082560 A 12/2007
CN 101726972 A 6/2010
CN 102428377 A 4/2012
CN 102472738 A * 5/2012 ............. G01N 21/51
CN 202869924 U 4/2013
CN 109073529 A 12/2018
CN 121026886 A * 11/2025 ............. G16C 20/20
CN 121384739 A * 1/2026 ............. G01N 15/06
JP H10213539 A 8/1998
KR 20170101294 A 9/2017
KR 102252326 B1 5/2021
TW 201200856 A 1/2012
TW 201836705 A 10/2018

* cited by examiner

2a=240 nm

REAL-TIME DETECTION OF PARTICULATE MATTER DURING DEPOSITION CHAMBER MANUFACTURING

RELATED APPLICATION

This application is a Divisional application of U.S. patent application Ser. No. 16/946,348, filed Jun. 17, 2020, entitled "REAL-TIME DETECTION OF PARTICULATE MATTER DURING DEPOSITION CHAMBER MANUFACTURING," which claims benefit of U.S. Provisional Application Ser. No. 62,869,480, filed Jul. 1, 2019, the entire contents of both applications are hereby incorporated in their entirety by reference herein.

TECHNICAL FIELD

This instant specification generally relates to controlling and improving quality of materials manufactured in deposition chambers. More specifically, the instant specification relates to real-time detection of particulate matter in deposition chambers performed without interruption of the manufacturing process occurring therein.

BACKGROUND

Manufacturing of modern materials often involves various deposition techniques, such as chemical vapor deposition (CVD) or physical vapor deposition (PVD) techniques in which atoms of one or more selected types are deposited on a substrate held in low or high vacuum environments that are provided by vacuum chambers. Materials manufactured in this way may include monocrystals, semiconductor films, fine coatings, and numerous other substances used in practical applications. Many of such applications critically depend on the purity of the grown materials. Although the vacuum environment inside the chamber significantly decreases the amount of contaminants (e.g., those that are present in the ambient atmosphere) present in the growth setting, some contaminants can still find a way into the chamber. For example, impurities may be delivered into the deposition chamber with the flow chemicals used in CVD or with sputtering (or evaporation) sources used in PVD. Such impurities may be released into the environment of the deposition chamber and become lodged, as a defect, in the material being manufactured. This contaminates the material and adversely affects its morphology. Minimizing or otherwise controlling the amount of contaminants inside the deposition chamber as well as preventing those contaminants that are nonetheless present in the chamber from reaching the substrate hosting the material are critical manufacturing challenges.

DETAILED DESCRIPTION

Figure 1:
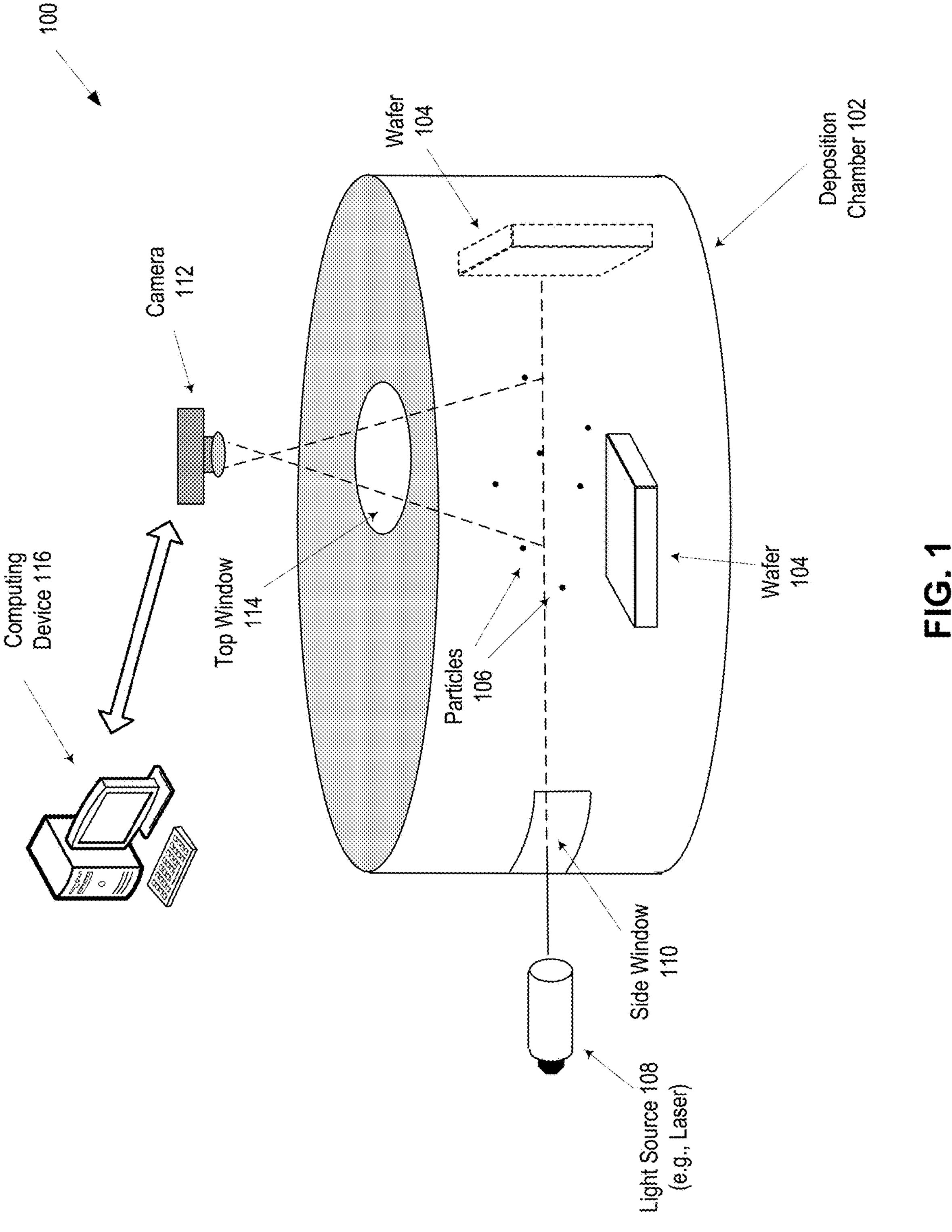
FIG. 1 illustrates schematically a system that implements real-time detection of particulate contaminants present inside a deposition chamber, based on light scattering data for scattering of an incident beam of light by the contaminants, in one exemplary implementation.

The implementations disclosed herein provide for real-time detection of particulate matter, such as impurities or contaminants, inside a deposition chamber without interrupting a manufacturing deposition process (e.g., without opening and directly accessing the deposition chamber). The implementations may be performed during the manufacturing deposition process. One or more light sources may deliver one or more beams of light into the deposition chamber through one or more transparent windows. The beams of light may interact with the particulate matter inside the chamber and produce a scattered light. The scattered light may escape from the chamber through some of the transparent windows where it may be detected by a camera. The camera may be focused to observe a part of the illuminated region inside the chamber. The camera may image locations of particles inside the chamber and may further generate machine-readable data (e.g., digital data) indicating the intensity of the scattered light for various light sensors of the camera. The camera may provide the machine-readable data to a processing device (e.g., a computer) to generate light scattering data. The light scattering data may map the intensity of the scattered light to actual physical locations inside the camera, based on parameters of the camera, such as a focal distance of the camera lens, the distance from the camera lens to the chamber, a focal distance of the camera lens, and the like. The processing device may further determine a distribution of particles inside the illuminated region of the deposition chamber, based on the light scattering data. In some implementations, the processing device may be able to estimate, based on the determined distribution of particles and a stored calibration data, the quality of the material(s) grown inside the deposition chamber.

The disclosed implementations pertain to a variety of manufacturing techniques that use deposition chambers, such as chemical vapor deposition techniques (CVD), physical vapor deposition (PVD), plasma-enhanced CVD, plasma-enhanced PVD, sputter deposition, atomic layer CVD, combustion CVD, catalytic CVD, evaporation deposition, molecular-beam epitaxy techniques, and so on. Although the most significant practical impact of the disclosed implementations may be expected to occur in techniques that use vacuum deposition chambers (e.g, ultrahigh vacuum CVD or PVD, low-pressure CVD, etc.), the same systems and methods may be utilized in atmospheric pressure deposition chambers for non-intrusive monitoring of the chamber environments during deposition processes. In the following, the terms "deposition chamber" and "chamber" are used interchangeably to indicate any such chamber used in deposition manufacturing regardless of the vacuum conditions required by a specific technique used.

The contaminants present in the chamber may penetrate into the chamber from the ambient atmosphere (e.g., during preparatory stages of manufacturing), with the chemicals injected into the chamber for the actual deposition onto the wafer, with the chemicals used to produce a plasma environment, or as impurities in the ultra-pure water used for cleaning parts of the chamber. The contaminants may be delivered with the flow of the chemicals to the deposition region during manufacturing. The contaminants may attach to the walls of processing modules and delivery channels and serve as seeds (nucleation centers) for spurious in-situ growth. Subsequently, such in-situ growths may de-attach, "shed" into the wafer material, and become a defect therein.

A standard technique for monitoring contaminants inside a deposition chamber consists in preparing special "witness wafers" to probe the chamber environment at specific times. The witness wafer may be carefully prepared in an ultra-clean environment, and its surface may be inspected using highly sensitive monitoring systems. The witness wafer may be then inserted into the chamber for control depositions. Subsequently, the witness wafer may be inspected again and the amount of contaminants deposited on its surface may be determined. From the amount and type of impurity deposits, one may infer the conditions of the chamber environment and estimate the quality of the product yield of the manufacturing process.

This or similar approaches to quality monitoring suffer from a number of shortcomings. The process of witness wafer preparation, insertion into the chamber, and the subsequent testing is both time-consuming and expensive, and thus is wasteful of valuable resources. Such approaches generally probe the chamber conditions at specific times and do not monitor the chamber environment during the actual product manufacturing. By their very design, such invasive methods disrupt the temperature dynamics, as well as the flow of atoms and contaminants inside the chamber and do not function under actual run-time conditions. Accordingly, the chamber environment during control depositions may be significantly different from its actual state during manufacturing. Moreover, insertion and retrieval of the witness wafer may introduce additional contaminants into the chamber. Even under ideal conditions, the witness wafer method has significant intrinsic limitations, such as impossibility of real-time monitoring of positions of contaminants and their dynamics. The method provides very limited feedback about how and when the contaminants enter the chamber environment and what setup adjustments would be the most effective in reducing the amount of contaminants near the wafer.

The present disclosure addresses this and other limitations of the existing methods. Disclosed herein are systems and methods that can be used for non-intrusive real-time in-chamber monitoring of concentration and dynamics of contaminants by using light scattering data collected through one or more windows of the chamber. The term "contaminant" may include an impurity, e.g., a particle (or a cluster of particles) of a wrong chemical type. For example, during silicon solar cell manufacturing, impurities can include iron, copper, molybdenum, or other metals that may decrease the solar efficiency so significantly as to make solar cell production economically non-viable. The term "contaminant" may also include particles of the correct chemical type but with a wrong size or morphology. For example, a silicon cluster that has not properly disintegrated into atoms may end up deposited into a silicon chip as a whole, constituting a defect that detrimentally affects mobility of charge carriers in the chip.

FIG. 1 illustrates schematically a system 100 that implements real-time detection of particulate contaminants present inside a deposition chamber, based on light scattering data for scattering of an incident beam of light by the contaminants, in one exemplary implementation. FIG. 1 is intended as an illustration, as some components shown in FIG. 1 may be optional or replaceable with other components having the same or similar functionality. The system 100 may have a deposition chamber 102, such as a vacuum deposition chamber, in one implementation. The deposition chamber 102 may have a circular horizontal cross-section, as shown in FIG. 1, or may have any other design known in the art. The deposition chamber 102 may be capable of holding a wafer 104 or multiple wafers (not shown) to support growth of a material on the wafer(s). The wafer(s) may be positioned horizontally (as shown by the solid-line depiction of the wafer 104) or vertically (as shown by the dashed-line depiction of the wafer 104), or in any other way. In some implementations, one or more wafers may be positioned at an angle to the horizontal plane. The wafer 104 may be made of a semiconducting material (e.g., silicon), dielectric (e.g., silicon oxide) or any other appropriate material. The wafer 104 may be patterned or unpatterned. There may be a flow of gases (e.g., chemical precursors used in deposition) and/or a plasma (a partially-ionized gas of electrons and ions) inside the deposition chamber 102. In some implementations, such as when the deposition chamber 102 is used with sputtering deposition techniques, the chamber 102 may contain a target (not shown), such as a sputtering target, that is bombarded with atoms of ions (such as Argon ions, in one implementation) to produce a flow of ejected particles. Various flows inside the chamber 102 (such as the flows of precursors, plasma, atoms/ions sputtered by the target) may be diffusive (when the density of gas/plasma is high) or ballistic (when such density is low). The wafer 2may be located below the region of the gas/plasma, e.g., when the deposition of the material is facilitated by gravity, in some implementations. In other implementations, the wafer 104 may be positioned above the region of the gas/plasma, e.g. when the deposition is performed by sputtering. Other arrangements of the wafer 104 may also be possible and the disclosed implementations are fully applicable to all such arrangements.

The gas and/or plasma of atoms/ions used in deposition processes may be carried to the region of the deposition chamber 102 in the vicinity of the wafer 104. The gas/plasma may also deliver particles 106, such as contaminants, impurities, or any other potential defects that may eventually be lodged in the yield of the deposition process. The particles 106 may be located above the wafer 104, as shown in FIG. 1, below the wafer 104, or anywhere else in relation to the wafer. To detect particles 106, during run-time of a manufacturing process inside the deposition chamber 102, a light source 108 may direct an incident beam of light into the inside region of the chamber 102 through one or more windows, such as a side window 110. The window may be made of any transparent or semi-transparent material. The location of a window for the delivery of a light beam into the chamber may differ from that depicted in FIG. 1. The side window may have fixed dimensions or may have adjustable dimensions. The light beam produced by the light source 108 may be a coherent beam, such as a laser beam, in some implementations. In other implementations, the light source 108 may produce natural light, linearly, circularly, or elliptically polarized light, partially-polarized light, focused light, and so on. The light source 108 may produce a continuous beam of light or a plurality of discrete pulsed signals. The light source 108 may produce a collimated beam of light, a focused beam of light, or an expanded beam of light. The light source 108 may produce a monochromatic beam having a frequency/wavelength within a narrow region of frequencies/wavelengths near some central frequency/wavelength, in some implementations. Alternatively, multiple monochromatic light beams may be used. In other implementations, the light source 108 may produce a beam with a broad spectral distribution, e.g., a white light. In some implementations, the beam is in the visible part of the spectrum. In some implementations, the spectral distribution of the beam may include infrared or ultraviolet frequencies undetectable to a human eye.

The incident beam of light produced by the light source 108 may illuminate a region of the deposition chamber 102. This illuminated region may be a part of the chamber that is located at or near the wafer 104, or may be at some distance away from the wafer 104. In some implementations, the illuminated region may be a cross-sectional slice of the part of the chamber 102 visible through the side window 110. In some implementations, the illuminated region may be a small portion of the chamber 102 while in other implementations, the illuminated region may be a substantial part of the chamber 102.

The incident beam of light may interact with particles 106 present inside the illuminated region of the chamber 102 and produce a scattered light. The term "scattered light" includes any electromagnetic radiation that may be caused by the incident light, such as electromagnetic radiation reflected from the surface of the particles 106 or a radiation generated within the bulk of the particles. The term "scattered light" includes electromagnetic radiation having the same frequency as the frequency of the incident light as well as any frequency that is greater (e.g., due to up-conversion of photons) or smaller (e.g., a luminescent light) than the frequency of the incident beam of light.

Some amount of scattered light may escape from the chamber 102 through one or more windows of the chamber. For example, as schematically depicted in FIG. 1, in some implementations, the scattered light may pass through a top window 114. The scattered light, which escapes through a window (e.g., the top window 114), may be detected by a camera 112. The word "camera" includes any digital, analog photographic, or video camera. The word "camera" also includes any other device that is capable of detecting intensity of light, such one or more (or any combination thereof) of a photoemission cell, a photovoltaic cell, a photoreceptor cell, a photochemical sensor (e.g., photographic plates and films), a polarization sensor, a photodetector, a semiconductor sensor, a thermal detectors of light, and so on. For example, the camera 112 may be a digital camera using charge coupled device (CCD) sensors. In another implementation, the camera 112 may be a digital camera using complementary metal oxide semiconductor (CMOS) sensors.

The camera 112 may have one or more optical lens. The camera 112 may operate, as a matter of principle, by collecting photons of scattered light from various locations within the field of view of the camera that is in its focus. As disclosed in more detail below, the focus of the camera 112 may be changed/repositioned in the course of particles detection. The particles 106 may be detected as bright spots in the scattering data, e.g., digital images, generated by the camera 112, in some implementations. In some implementations, the scattering data may include images of Fraunhofer diffraction patterns around the main bright spots corresponding to the particles. In some implementations, the size of the particles may be determined by measuring the ratio of the total amount of light (i.e. the total number of photons) produced by the particle to the intensity of the incident beam of light and in further view of the particle's exposure to the incident beam. In some implementations, the size of the particle may be further ascertained from the size of the Fraunhofer rings.

Although shown in FIG. 1 is a situation where the incident beam of light enters the chamber through one window (e.g., the side window 110) and the scattered light is detected through a different window (e.g., the top window 114), in some implementations, a single window may be used for both purposes. In such implementations, the incident beam may be positioned in such a way as to prevent direct reflection from the surface of the window reaching the camera 112. Additionally, an anti-reflective coating may be used to further prevent reflection/glare.

The camera 112 may be capable of storing captured images in an analog or digital form. In some implementations, the camera 112 may be capable of generating and storing a data file containing machine-readable data (e.g., digital data) indicating the intensity of the scattered light for various light sensors of the camera 112. The camera 112 may provide the machine-readable data to a processing device 116 to generate light scattering data. The light scattering data may map the intensity of the scattered light to actual physical locations inside the camera, based on parameters of the camera, such as a focal distance of the camera lens, the distance from the camera lens to the chamber, a focal distance of the camera lens, and the like. For example, the scattering data may be an image of intensity of the scattered light as a function of two Cartesian coordinates within a field of view of the camera 112 (or a function of two angles, a polar angle and an azimuthal angle) within the same view. The processing device may further determine a distribution of particles inside the illuminated region of the deposition chamber, based on the light scattering data. In some implementations, the camera 112 may be connected to the computing device 116 over a wireless or a wired network. In some implementations, the computing device 116 may be integrated into the camera 112. In some implementations, the processing device may be able to infer, based on the distribution of particles 106, the quality of the yield material being grown on the wafer 104. For example, the computing device 116 may execute a software program that inputs the scattering data from a memory device of the camera 112 or from a memory device of the computing device 116. The software program may determine the density of the particles 106 within the illuminated region of the chamber 102. The density of particles may refer to a number of particles inside a unit of volume of the chamber or within a unit of the cross-sectional area of the chamber. In some implementations, the software program may determine, based on the scattering data, the volume density n(d) as a function of the distance d to the wafer. To measure the density n(d) of the particles, the camera may consecutively focus at different depths inside the chamber 102. Additionally, for each increment of the distance d, the light source 108 may be repositioned at the corresponding depths of the camera 112 to provide the best imaging conditions for the camera 112. The software program may then access a calibration data from the memory device and predict, based on the calibration data, one or more parameters describing the quality of the yield material being produced by the chamber 102. For example, the parameters describing the quality of the material may include the size, the concentration, and the type of defects present in the material.

The computing device 116 may be capable of determining the size of the defect by measuring the total amount of light scattered by the particle. The computing device 116 may further be capable of determining the type of the material based on the scattering data. For example, both total amount of scattered light (e.g., the total scattering cross section) and the angular distribution of the intensity of scattered light (e.g., the differential scattering cross section) by a particle may be indicative of the material of the particle and its size. The computing device 116 may be capable of predicting the concentration of the defects in the material by first determining the density n(d) of the particles 106 via counting the number of scattering centers in the scattering data produced by the camera 112. The calibration data may be obtained by correlating the observed density of particles n(d) with a quality of the yield materials during test (calibration) runs where the quality may be measured using a number of available techniques, such as scanning electron microscopy, tunneling electron microscopy, x-ray scattering, neutron scattering, and so on. An output of the calibration process may be a correspondence, such as a mathematical relation (or a series of mathematical relations), a plot (or a series of plots), a table (or a series of tables), and the like, between the scattering data (such as the number of scattering centers, the total intensity of scattering, the angular dependence of scattering) and the predicted quality of the yield material (including the type, size, and concentration of defects). In some implementations, the calibration data may provide for the ranges of accuracy of quality predictions.

In some implementations, the system 100 illustrated in FIG. 1, as well as systems illustrated in FIGS. 2*a*, 2*b*, 3*a*, 4, and 5 below, may be used to not only determine the locations of large particles (e.g., particles whose size is many atomic sizes), which constitute undesired contaminants, but also map the density of atomic-size particles that are intended to be used in deposition. Unlike the larger contaminant particles, which may be imaged as bright spots in the scattering data, the atoms used in deposition may not be individually visible from the scattering data. Instead, the density of atoms $n(\vec{r})$ may be imaged as a variation in a smooth background of the scattered light. Determination of the density of atoms $n(\vec{r})$ may be accomplished based on the number of detected scattered photons originating from a particular point referenced by its radius vector $\vec{r}=(x,y,z)$ inside the illuminated region of the chamber 102. Accordingly, the density of atoms $n(\vec{r})$ may be inferred from the intensity of a delocalized glow detected by the camera 112 with higher intensities corresponding to higher density of the atoms. The atoms detected by this technique may include both the atoms of the active substance intended for deposition on the wafer 104 as well as the atoms of auxiliary plasma, or any other atoms that may be injected into the chamber 102. Such imaging may be useful in determining the flow dynamics inside the chamber. For example, such imaging may be capable to determine how efficiently the atoms of the deposition substance are delivered to the region near the wafer 104, how homogeneous the concertation of the atoms is across the length and width of the wafer, how well ionized and uniform the plasma is inside the chamber, and so on.

Figure 2A:
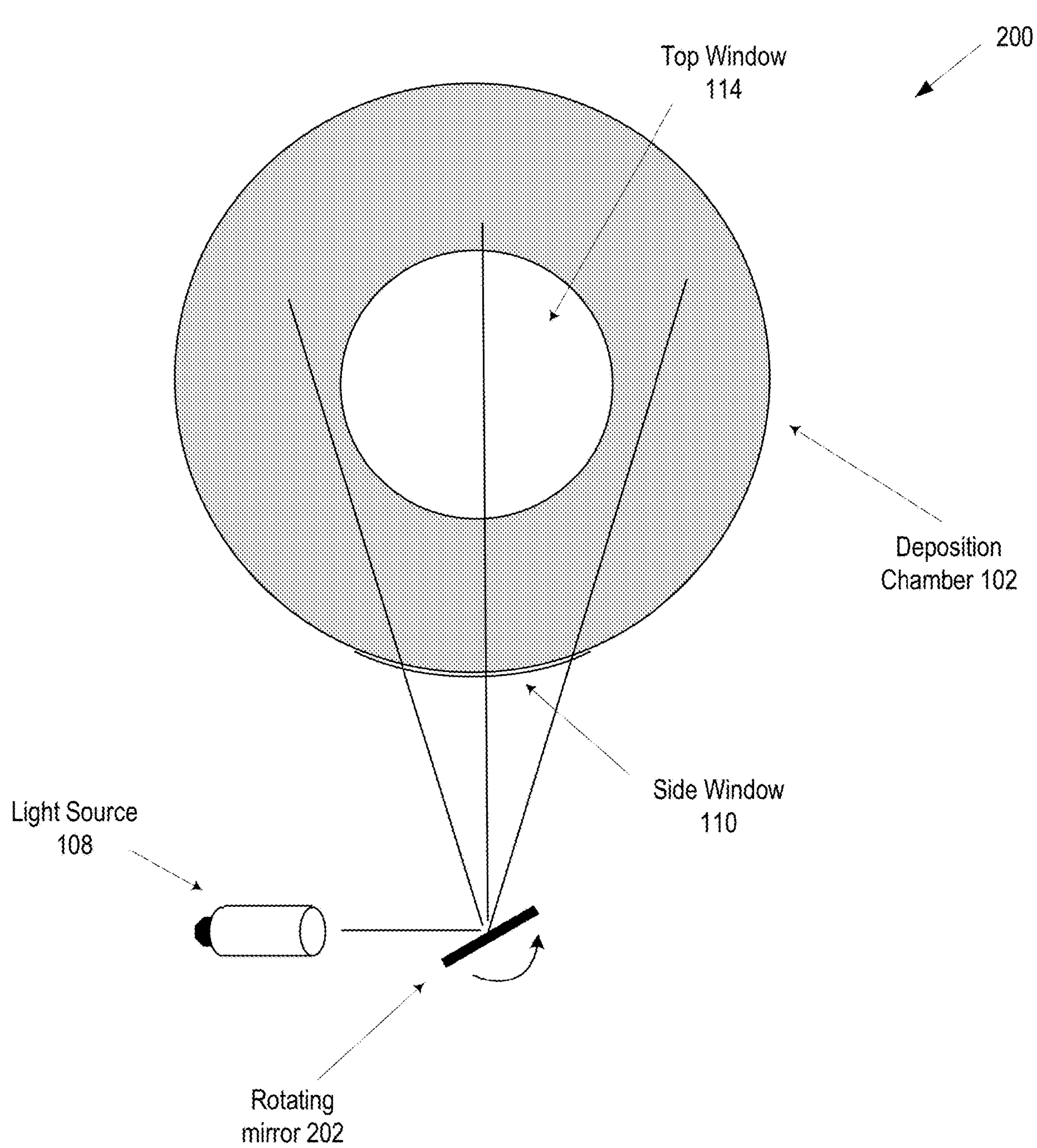
FIG. 2A is a schematic view of a system that implements real-time detection of particulate contaminants present inside a deposition chamber, based on light scattering data, that uses a rotating mirror to illuminate the inside of the deposition chamber with a collimated beam of light, in one exemplary implementation.

FIG. 2A is a schematic view of a system 200 that implements real-time detection of particulate contaminants present inside a deposition chamber, based on light scattering data, that uses a rotating mirror to illuminate the inside of the deposition chamber with a collimated beam of light, in one exemplary implementation. Some components of the system 200 may be the same as some components of the system 100, as indicated by the corresponding matching numbers. FIG. 2A indicates a top view of the deposition chamber 102, as may be observed from a vantage point of the camera 112. In the implementation illustrated in FIG. 2A, the light source 108 (e.g., a laser) may produce a narrow collimated beam of light directed into the chamber 102 through the side window 110 by a rotating mirror 202. The rotating mirror may cause the collimated beam to scan a region of the chamber 102, such as the region below the top window 114, while the camera 112 may take images with the frame rate and the shutter speed adjusted (e.g., by the computing device 116) so the entire field of view is uniformly illuminated. For example, the frame rate may be set equal to the period of mirror rotation whereas the shutter speed may be set equal to the duration of the time that the beam is within the field of view of the camera 112. In some implementations, the scanning speed (e.g., the angular velocity of the mirror) may be maintained constant during each swath of the beam across the field of view so that the particles of equal size (and located at the same distance from the mirror) are illuminated for equal amounts of time. Therefore, the particles of equal size may receive equal amounts of light and may produce the same amount of scattered light. This may improve the consistency with which particles are detected and the accuracy with which their sizes are determined.

Figure 2B:
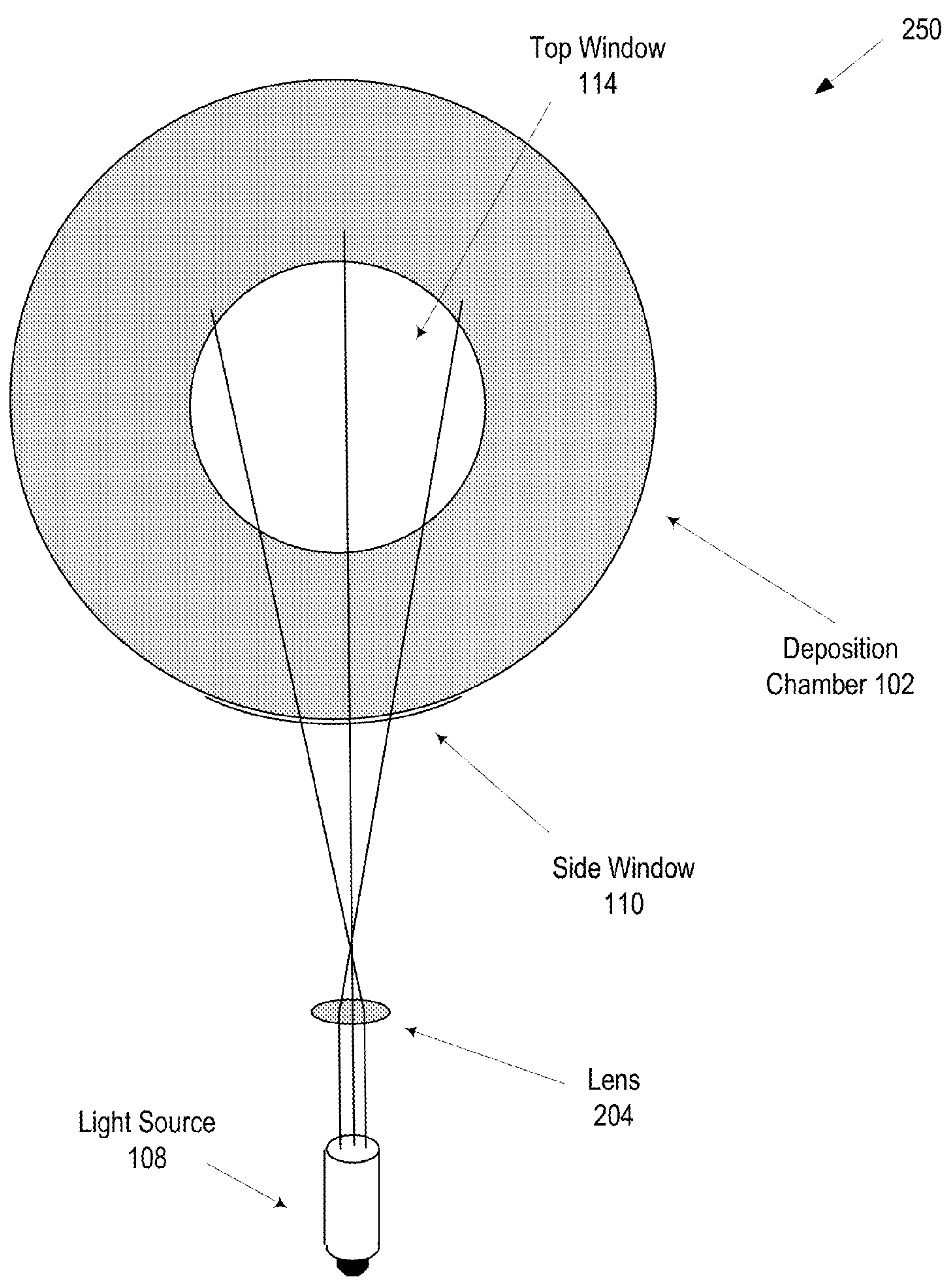
FIG. 2B is a schematic view of a system that implements real-time detection of particulate contaminants present inside a deposition chamber, based on light scattering data, that uses a lens to illuminate the inside of the deposition chamber with an expanded beam of light, in one exemplary implementation.

FIG. 2B is a schematic view of a system 250 that implements real-time detection of particulate contaminants present inside a deposition chamber, based on light scattering data, that uses a lens to illuminate the inside of the deposition chamber with an expanded beam of light, in one exemplary implementation. In the implementation shown in FIG. 2B, the uniformity of the irradiation of the field of view of the camera 112 may be achieved without moving elements. For example, a collimated beam of light produced by the light source 108 may pass through a lens 204 to produce an expanding beam. In some implementations, the angle of expansion of the beam may be sufficiently large to illuminate the entire field of view of the camera 112, for example, the area visible through the top window 114, or a part of the visible area that is in focus of the camera 112. In some implementations, the lens 204 may be cylindrical so that the beam is expanded in one direction (e.g., in the horizontal direction, as depicted) but remains collimated in the other direction (e.g., in the vertical direction) and illuminates a narrow slice of the chamber 102. This may have an advantage of uniformly illuminating the points inside the chamber that have the same or almost the same distance from the camera 112 and therefore all (or most of) such points may be in focus of the camera 112 at the same time.

Although the instantaneous amount of light (e.g., the number of photons per unit of time) incident on any particle residing in the illuminated area is substantially lower than in the rotating setup of FIG. 2A, when the collimated beam is pointed directly at the particle, the total amount of light averaged over one swath of the beam may be the same, or similar, in both implementations. In some implementations, the expanded beam setup of FIG. 2B may be preferred since it may not use moving parts or an elaborate synchronization scheme for synchronizing image acquisition by the camera 112 with the position of the mirror 202. In other instances, the rotating mirror setup of FIG. 2A may be favored instead.

The plane of illumination may be adjusted between consecutive measurements by adjusting the elevation of the light source 108. For example, for each position of the light source 108, the beam of light produced by the light source 108 and the lens 204 may illuminate a first (e.g., planar) sub-region of the field of view of the deposition chamber 102 and the detection of the particles 106 may be performed as described above. Subsequently, the beam of light may be repositioned by moving the light source 108 in the vertical direction (up or down) so that the beam of light illuminates a second sub-region of the field of view. The camera 112 may be moved together with the light source 108 so that the new illuminated sub-region remains in its focus, in some implementations. For example, the camera may be mounted in such a way that it remains rigidly connected to the light source. In other implementations, the camera 112 may remain fixed relative to the chamber 102 while the focal distance of the camera is adjusted to bring the new sub-region into focus. The vertical shift between two consecutive readjustments may be less than the vertical spread of the beam in the vertical direction (e.g., 1 mm, in one implementation), so that the entire vertical extend of the visible area is eventually covered. In some implementations the repositioning of the beam of light is performed in the horizontal (or any other) direction, rather than in the vertical direction.

In some implementations, the lens 204 may be a convergent lens so that upon passing through the lens the beam first passes through a real focal point before expanding, as depicted schematically in FIG. 2B. In other implementations, however, the lens 204 may be a divergent lens with an imaginary focal point, so that the beam expands immediately upon passing through the lens 204. In some implementations, the lens 204 may be a compound lens made of a plurality of lenses. Some or all of the lenses may be designed to reduce chromatic and/or optical aberration. In some implementations, where the uniformity of the light beam is not essential, such as where the illuminated area is not very large, the lens 204 may be a spherical lens.

Figure 3A:
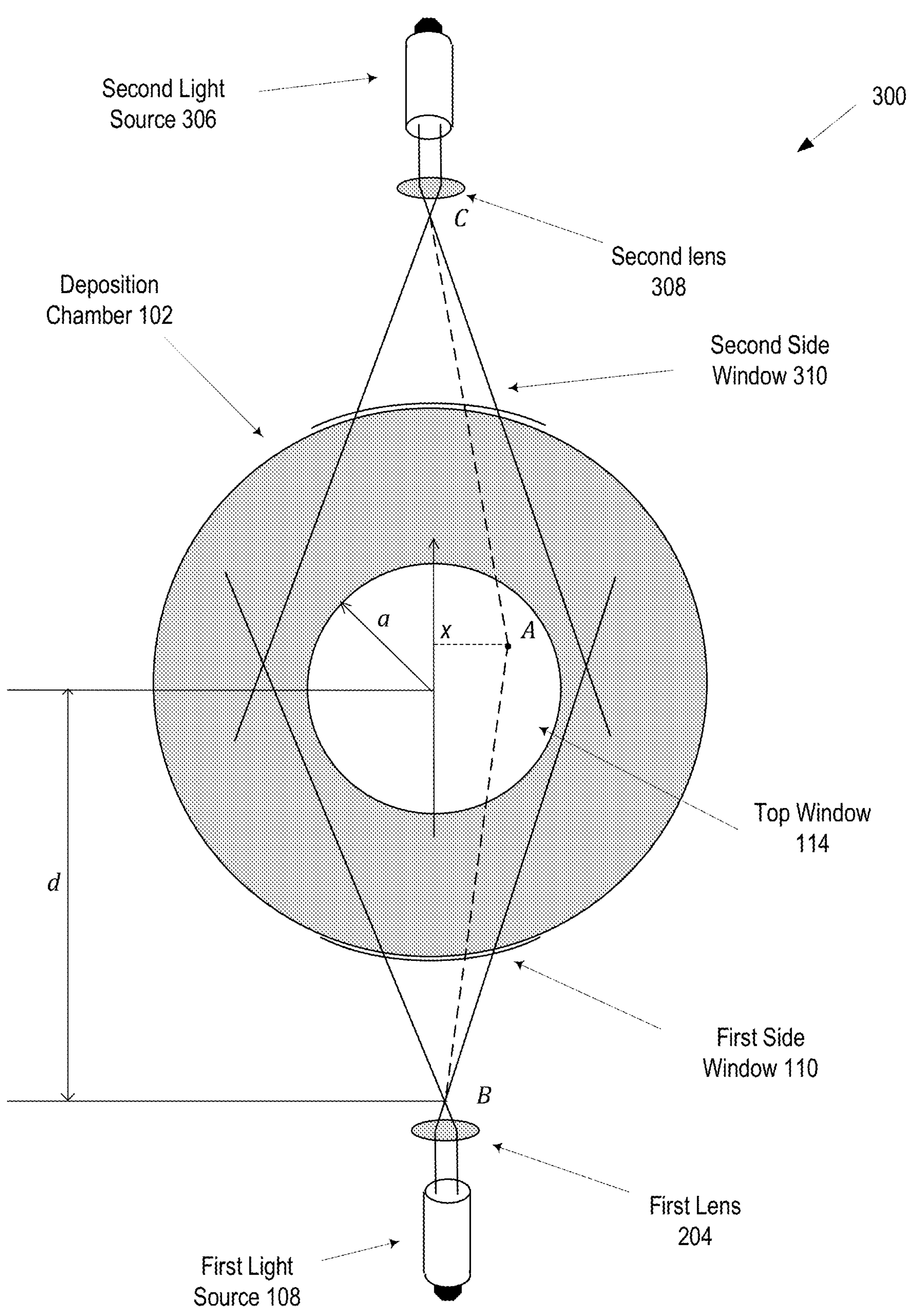
FIG. 3A is a schematic view of a system that implements real-time detection of particulate contaminants present inside a deposition chamber, based on light scattering data, that uses two light sources to achieve a more uniform illumination of the inside of the deposition chamber, in one exemplary implementation.

FIG. 3A is a schematic view of a system 300 that implements real-time detection of particulate contaminants present inside a deposition chamber, based on light scattering data, that uses two light sources to achieve a more uniform illumination of the inside of the deposition chamber, in one exemplary implementation. Both systems 200 and 250 shown in FIGS. 2*a* and 2*b*, respectively, may have a disadvantage of having an insufficient uniformity of illumination of the target area (e.g., the visible area inside the chamber under the top window 114). More specifically, while the uniformity of illumination may be good in the direction perpendicular to the optical axis of the system, the uniformity along the optical axis, e.g., the x axis on FIG. 3A, may be significantly less. This happens because for a cylindrically expanded beam, the intensity of light decays inversely proportional to the distance from the center of the beam (e.g., the focal point of the lens). The setup of FIG. 3A may have an advantage of significantly improving the uniformity of illumination. The system 300, in addition to the first light source 108 and the first lens 204, may include a second light source 306 and a second lens 308 to provide a second expanding beam of light. The second beam may be delivered into the deposition chamber 102 through a second side window 310. The maximum uniformity of illumination may be achieved if the two beams are directed from the opposite sides of the chamber 102, at a 180° angle, as shown in FIG. 3A, although an angle of less than 180° C. an still improve uniformity substantially, albeit to a lesser degree.

To illustrate the degree to which the double-beam setup of FIG. 3A improves a uniformity of illumination, consider a point A inside the illuminated region of the chamber 102. The first beam has a center at a point B and the second beam has a center at a point C. Shown is or an illustrative example of a circular top window 114 of radius a, with the x-axis chosen to have the origin (x=0) at the center of the top window. Neglecting a small deviation of the line AB from the optical axis of the system, the intensity of the first beam at a point A is $$I_1(x) = \frac{\beta}{d+x}.$$

Here d is the distance from the origin x=0 to the center of the beam B and β is a coefficient proportional to the total power of the beam. Similarly, $$I_2(x) = \frac{\beta}{d-x}$$

is the intensity of the second beam at the point A. Correspondingly, the total intensity of the two beams at the point A is $$I(x) = I_1(x) + I_2(x) = \frac{2\beta d}{d^2 - x^2}.$$

The degree of uniformity of illumination may be estimated as the ratio of the minimum intensity to the maximum intensity within the field of view:

$$U = \frac{I_{min}}{I_{max}}.$$

The closer the value U is to 1, the more uniform is the illumination. Conversely, values U that are close to 0 than to 1 indicate a very non-uniform illumination. In the double-beam setup, the minimum illumination (within the top window 114) is achieved at x=0 whereas the maximum is found at x=a (and x=−a). Accordingly, the uniformity value for the double-beam illumination is $$U_{double} = 1 - \frac{a^2}{d^2}.$$

In contrast, for a single beam (e.g., first beam only) illumination, the minimum is at a point farthest from the center B of the beam (x=a) and the maximum is at the point closest to the center of the beam (x=−a):

$$U_{single} = \frac{1 - a/d}{1 + a/d}.$$

This illustrates that the improvement of the uniformity of illumination that may be achieved in a double-beam setup compared to a single-beam setup is $$\frac{U_{double}}{U_{single}} = \left(1 + \frac{a}{d}\right)^2.$$

In particular, for $\alpha \approx d/3$, as crudely corresponds to the depictions of FIG. 3A, in one exemplary implementation, the improvement in uniformity is about 1.8; the improvement becomes even more significant as the radius of the visible area a increases.

Figure 3B:
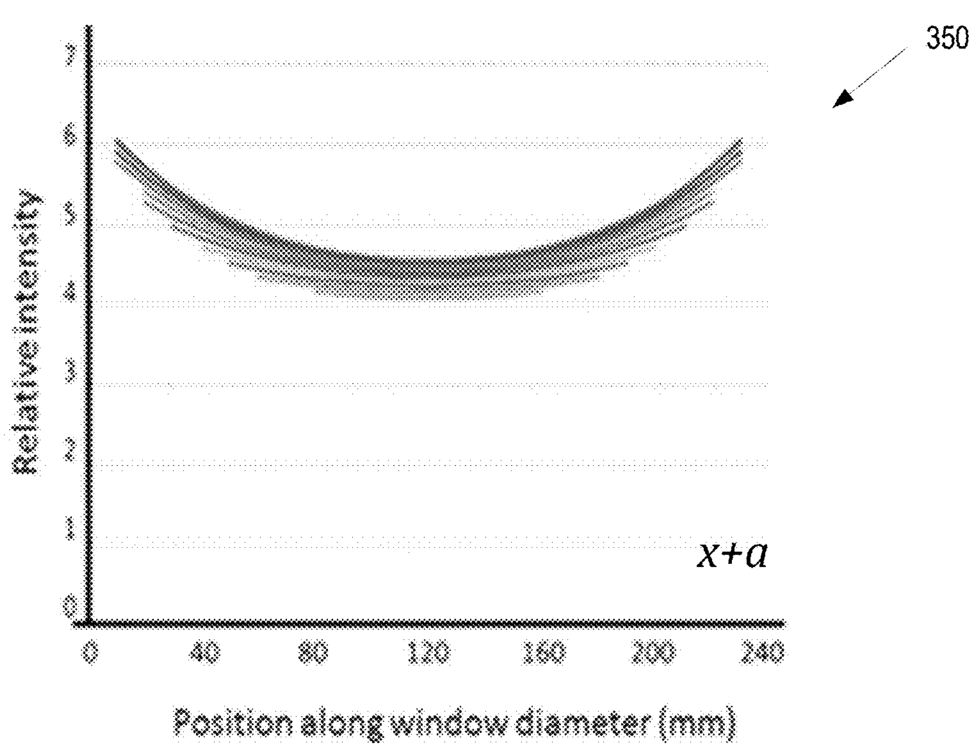
FIG. 3B is an illustration of a uniformity of illumination of a region inside a deposition chamber with two light beams, showing the relative intensity of light as a function of position along a diameter of a circular window into the deposition chamber, in one exemplary implementation.
Figure 3B:
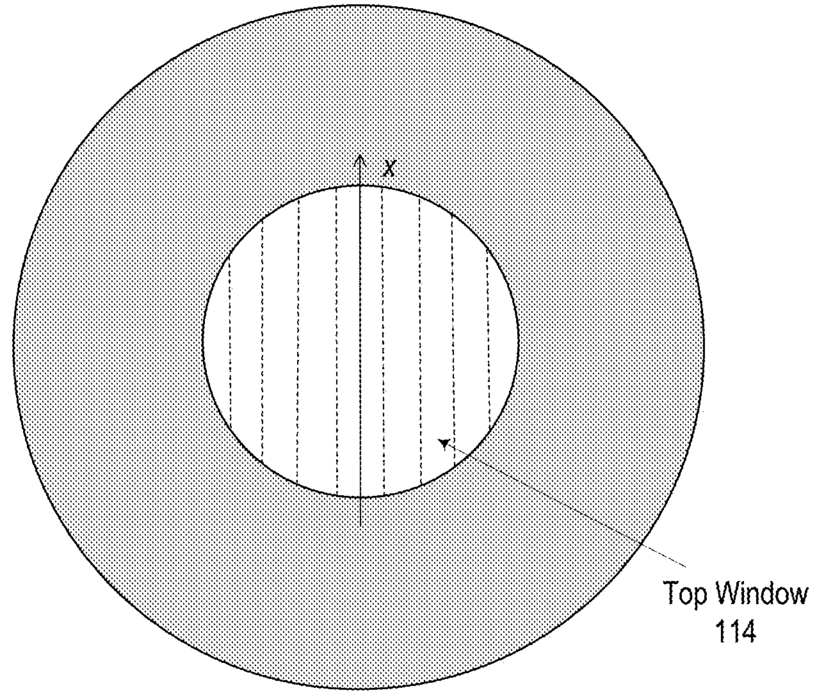

FIG. 3B is an illustration of a uniformity of illumination of a region inside a deposition chamber with two light beams, showing the relative intensity of light as a function of position along a diameter of a circular window into the deposition chamber, in one exemplary implementation. The plot 350 shows the total intensity of illumination as a function of position x+a, with reference to notations in FIG. 3A. Each of the curved lines shown in the plot 350 illustrates variation of the intensity along different lines within the top window 114 that are parallel to the x-axis, as indicated by the dashed lines within the top window 114 (bottom part of FIG. 3B). The curved lines shown in the plot 350 are of different lengths, since the length of the corresponding dashed lines varies with their placement relative to the axis of the system (i.e. varies with the distance to the x-axis), with the outer dashed lines having shorter length compared with the inner lines. In this illustrative example, the diameter of the field of view is 2a=240 mm and the distance from the center of the beam B to the field of view is d−a=100 mm. Although there is still a certain amount of variation of the total intensity, the variation does not exceed 30%, for this particular illustration.

Figure 4:
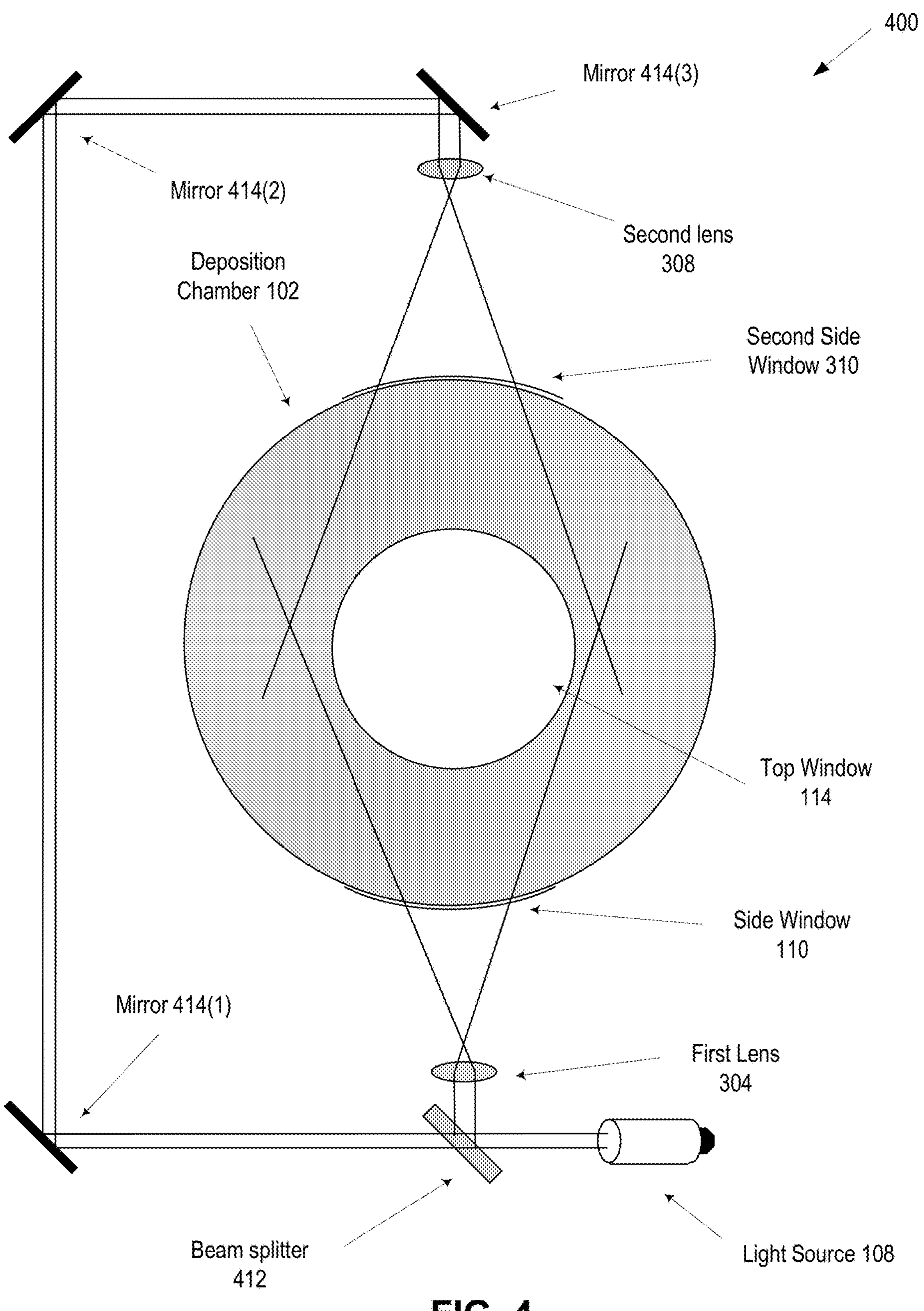
FIG. 4 is a schematic view of a system that implements real-time detection of particulate contaminants present inside a deposition chamber, based on light scattering data, that uses a single light source and a beam splitter to achieve a more uniform illumination of the inside of the deposition chamber, in one exemplary implementation.

The benefits of a two-beam setup may be exploited even when only one light source is deployed. FIG. 4 a schematic view of a system 400 that implements real-time detection of particulate contaminants present inside a deposition chamber, based on light scattering data, that uses a single light source and a beam splitter to achieve a more uniform illumination of the inside of the deposition chamber, in one exemplary implementation. The system 400 has a single light source 108 and a beam splitter 412. The beam splitter 412 may redirect a part (e.g., one half) of the beam produced by the light source 108. The redirected beam may be further redirected through a system of mirrors, such as mirrors 414(1)-(3) and through the second lens 308 and the second side window 310 into the chamber 102. In the implementation shown, three mirrors 414 are used. In other implementations, the number of mirrors may be more or less than three. For example, two mirrors may be sufficient to deliver the split-off beam to the second lens 308 directly across the chamber form the first lens 204.

Figure 5:
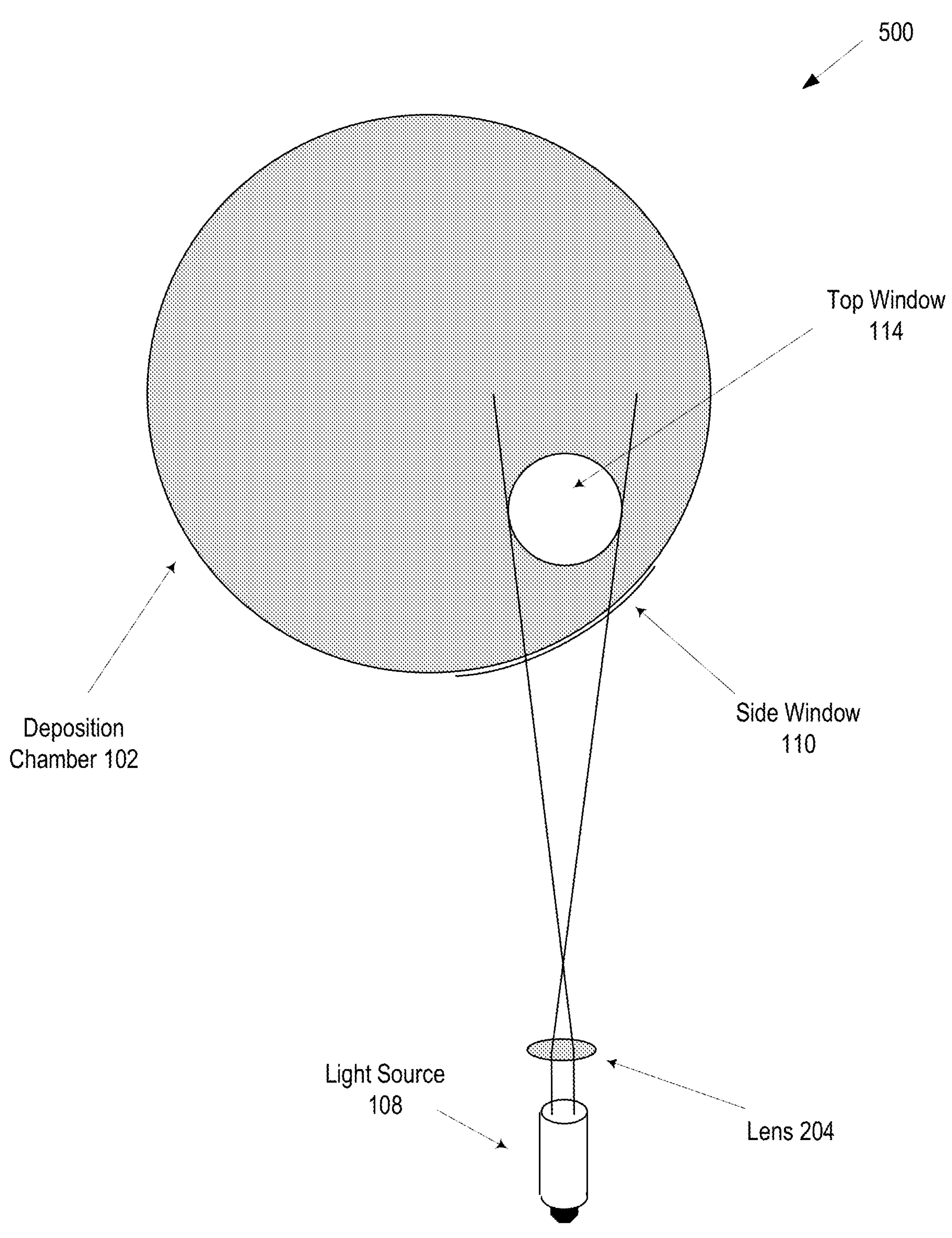
FIG. 5 is a schematic view of a system that implements real-time detection of particulate contaminants present inside a deposition chamber, based on light scattering data, where a single light source is used together with a window that is a small relative to the size of the deposition chamber, in one exemplary implementation.

FIG. 5 is a schematic view of a system 500 that implements real-time detection of particulate contaminants present inside a deposition chamber, based on light scattering data, where a single light source is used together with a window that is small relative to the size of the deposition chamber, in one exemplary implementation. As follows from the earlier estimates of the uniformity U of illumination, in those implementations where the size of the transparent window is small, $\alpha \ll d$, the uniformity U is close to 1. Under such conditions, the extent of the beam is relatively small and it may be sufficient to illuminate the field of view with just one light source. Monitoring the chamber environment through a small window may be adequately performed in those situations where concentration of contaminants is sufficiently uniform throughout the chamber 102.

Figure 6:
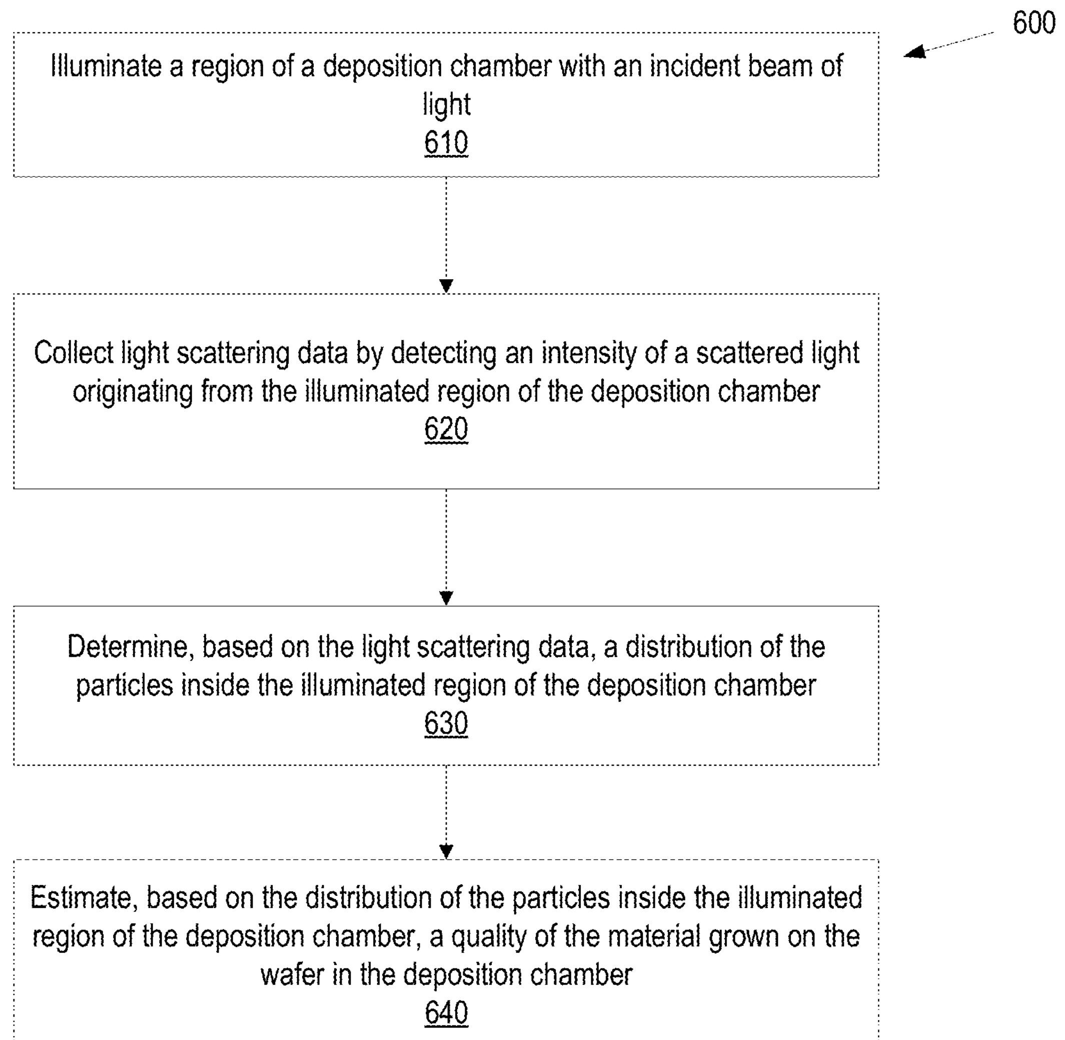
FIG. 6 is a flow diagram of one possible implementation of a method of real-time detection of particulate contaminants present inside a deposition chamber, based on light scattering data.

FIG. 6 is a flow diagram of one possible implementation of a method 600 of real-time detection of particulate contaminants present inside a deposition chamber, based on light scattering data. Method 600 may be performed using systems and components shown in FIG. 1, 2*a*, 2*b*, 3*a*, 4, or 5, or some combination thereof. Method 600 may be performed using a single light source producing a single beam of light, or a single light source and one or more beam splitters to produce more than one beam of light, or may be performed using multiple light sources. Some or all blocks of the method 600 may be performed responsive to instructions from a computing device, such as the computing device 116, in some implementations. The computing device 116 may have one or more processing devices (e.g. central processing units) coupled to one or more memory devices. The method 600 may be performed during a manufacturing process occurring inside the chamber, such as a process of deposition of atoms on the surface of a wafer, in one implementation. In some implementations, only one type of material is being deposited whereas in other implementations, a plurality of different types of materials may be deposited. In some implementations, the manufacturing process may involve more than one wafer. The manufacturing process may occur at low temperatures, or at temperatures that are less or significantly less than the room temperature. Alternatively, the manufacturing process may occur at the room temperature, above the room temperature, or significantly above it. In some implementations, the pressure inside the chamber may be less or significantly less than the atmospheric pressure, including a low vacuum or a high vacuum conditions. The method 600 may be performed without interrupting the manufacturing process, in some implementations.

The method 600 may include illuminating a region of a deposition chamber with an incident beam of light (610). The illuminated region may be adjacent to the wafer. The illuminated region may be separated from the wafer by some distance. The illuminated region may be in a different part of the chamber than the part that includes the wafer. The illuminated region of the chamber may include one or more sub-regions. For example, a given sub-region may be a narrow planar slice of the illuminated region. The sub-region may be located within a horizontal plane, a vertical plane, or any other plane intersecting the inside of the deposition chamber. Illuminating the entire region of the deposition chamber may be performed by illuminating a first sub-region with the incident beam of light, collecting the light scattering data for the first sub-region (as explained in block 620 below), repositioning the incident beam of light to illuminate the second sub-region, collecting the light scattering data for the second sub-region, and so on. Illumination may be performed using a beam produced by a single light source or a plurality of light sources. Illumination may be performed using a focused beam, a collimated beam, an expanded beam, or any combination thereof. One or more beams of light may enter the deposition chamber through one or more transparent or semi-transparent windows of the chamber.

The method 600 may continue with collecting light scattering data by detecting an intensity of a scattered light originating from the illuminated region of the deposition chamber (620). The scattered light may be escaping from the chamber through one or more windows, which may be the same or different from the windows through which one or more incident beams of light enter the chamber. Collecting light scattering data may include detecting the intensity of scattered light using any device or material that is sensitive to the intensity of light. In some implementations, collecting light scattering data may be performed with a digital or analog camera having one or more lenses focusing the scattered light onto, e.g., an array of light sensors of the camera. Each light sensor may correspond to a small region within the field of view of the camera of the illuminated region of the chamber. Depending on the intensity of scattered light reaching a particular light sensor (e.g., a pixel), the light sensor may generate an analog signal (such as a current signal or a voltage signal) such that the magnitude of the signal is representative of the intensity of the scattered light. The analog signal may be input on an analog-to-digital converter (ADC), which may output a digital value corresponding to the intensity of the scattered light reaching the light sensor. This digital value may be stored in a memory device together with a reference to the location of the pixel. The memory device may be a memory device of the camera or a memory device of a computing device (e.g., the computing device 116) communicatively coupled to the camera. As a result, the memory device may store a digitized mapping of the intensity of scattered light onto the array of the light sensors of the camera. The computing device may then generate light scattering data by associating each or some of the light sensors of the camera with a corresponding location of the field of view of the camera within the illuminated region of the chamber. Accordingly, the light scattering data may include the correspondence between the intensity of the scattered light to a position within the illuminated region where the scattered light originates.

The method 600 may continue with determining, based on the light scattering data, a distribution of the particles inside the illuminated region of the deposition chamber (630). To determine the distribution of particles, the light scattering data may be analyzed (e.g., by the computing device) to extract features in scattered light intensity that correspond to particles inside the deposition chamber. For example, the particles may be identified as localized bright spots in the light scattered data, or by characteristic diffraction patterns around main maxima or minima of the intensity. The identified locations of the particles may be stored in the memory device. In some implementations, the estimates of size and/or chemical type of the particles may be stored together with their locations. In some implementations, the distribution of the particles includes locations of all identified particles. This may be accomplished, for example, the identified particles are large clusters made of many atoms. In some implementations, as disclosed above, the particles are atomic-sized particles whose individual locations cannot be determined. In such implementations, the computing device may be capable of determining the density (e.g., the volume density—the number of atoms per unit volume) of such particles from analyzing a smooth background of the intensity of the scattered light. Determining the distribution of the particles in such implementations may include mapping the density of particles on the illuminated region of the chamber.

In some implementations, the method 600 may continue with estimating, based on the distribution of the particles inside the illuminated region of the deposition chamber, a quality of the material grown on the wafer in the deposition chamber (640). This may be done by comparing the determined distribution of the particles, by the computing device, with the calibration data stored in the memory device of the computing device or at any other storage location accessible to the computing device (e.g., on cloud).

The systems and methods disclosed herein may be used for direct measurement of the localization, density, and dynamics of contaminant particles at run-time during wafer processing. The systems and methods disclosed herein may have very high sensitivities limited only by the time of observation (e.g., exposure time) of the illuminated chamber and/or by the speed of the movement of the particles inside the chamber. The systems and methods disclosed herein may be used not only for quality monitoring during manufacturing, but may also be utilized for testing and development of various deposition chamber designs. The advantages of the disclosed implementations include, but are not limited to, the ability to map significant regions of the chamber at various distances from the wafer, an almost instantaneous feedback during run-time in-chamber processing, the absence of long and expensive pre-processing, an ability to implement chamber modifications during processing and measure the resulting changes to the chamber environment and dynamics of particles, and so on.

Figure 7:
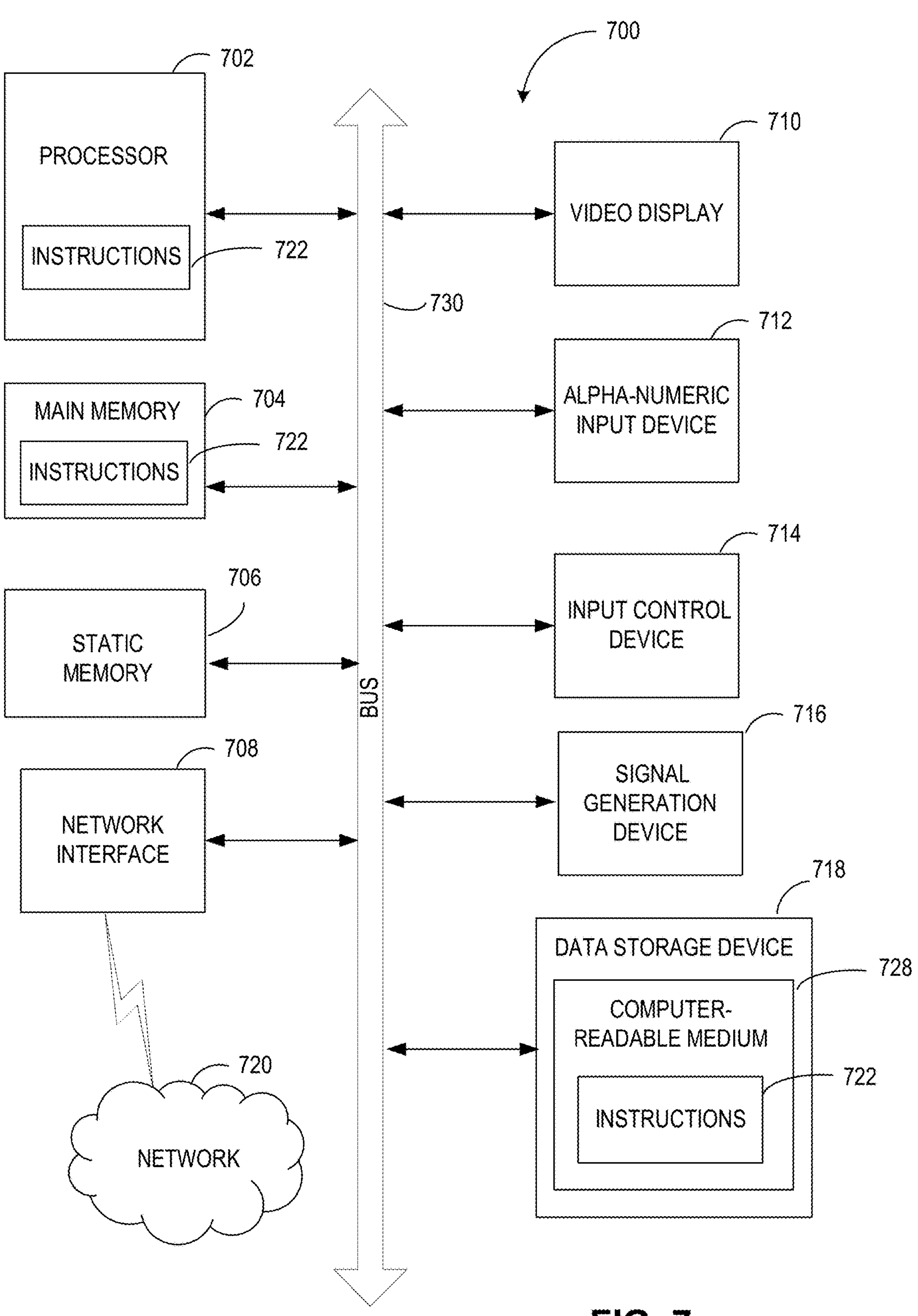
FIG. 7 depicts a block diagram of an example processing system capable of supporting real-time detection of particulate contaminants present inside a deposition chamber, based on light scattering data.

FIG. 7 depicts a block diagram of an example processing device 700 operating in accordance with one or more aspects of the present disclosure. The processing device 700 may be the computing device 116 of FIG. 1, in one implementation.

Example processing device 700 may be connected to other processing devices in a LAN, an intranet, an extranet, and/or the Internet. The processing device 700 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example processing device 700 may include a processor 702 (e.g., a CPU), a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 718), which may communicate with each other via a bus 730.

Processor 702 represents one or more general-purpose processing devices such as a microprocessor, central processing unit, or the like. More particularly, processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 702 may be configured to execute instructions implementing method 600 of real-time detection of particulate contaminants present inside a deposition chamber, based on light scattering data.

Example processing device 700 may further comprise a network interface device 708, which may be communicatively coupled to a network 720. Example processing device 700 may further comprise a video display 710 (e.g., a liquid crystal display (LCD), a touch screen, or a cathode ray tube (CRT)), an alphanumeric input device 712 (e.g., a keyboard), an input control device 714 (e.g., a cursor control device, a touch-screen control device, a mouse), and a signal generation device 716 (e.g., an acoustic speaker).

Data storage device 718 may include a computer-readable storage medium (or, more specifically, a non-transitory computer-readable storage medium) 728 on which is stored one or more sets of executable instructions 722. In accordance with one or more aspects of the present disclosure, executable instructions 722 may comprise executable instructions implementing method 600 of real-time detection of particulate contaminants present inside a deposition chamber, based on light scattering data.

Executable instructions 722 may also reside, completely or at least partially, within main memory 704 and/or within processing device 702 during execution thereof by example processing device 700, main memory 704 and processor 702 also constituting computer-readable storage media. Executable instructions 722 may further be transmitted or received over a network via network interface device 708.

While the computer-readable storage medium 728 is shown in FIG. 7 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A system comprising:

a process chamber;

an illumination system to produce a first incident beam of light, wherein the first incident beam of light illuminates a region of the process chamber; and a light detector to:

generate light scattering data comprising an intensity map of scattered light for at least a portion of the illuminated region, the scattered light produced upon interaction of the first incident beam of light with particles in the illuminated region, wherein the intensity map comprises a background portion and a plurality of maxima; and a processing device communicatively coupled to the light detector, the processing device to:

determine, using the background portion of the intensity map, a density of plasma-forming particles of a first size in the illuminated region; and determine, using the plurality of maxima of the intensity map, a density of contaminant particles of a second size in the illuminated region.

2. The system of claim 1, wherein the illumination system is further to produce a second incident beam of light, wherein the second incident beam of light improves uniformity of illumination of at least a part of the illuminated region compared with uniformity of illumination of the part of the illuminated region by the first incident beam of light.

3. The system of claim 2, wherein the second incident beam of light enters the process chamber from a different direction compared with the first incident beam of light.

4. The system of claim 2, wherein the illumination system comprises:

a first light source to generate the first incident beam of light, and a second light source to generate the second incident beam of light.

5. The system of claim 4, wherein at least one of the first light source or the second light source comprises a laser light source.

6. The system of claim 2, wherein the illumination system comprises a beam splitter to produce, using a common beam of light, the first incident beam of light and the second incident beam of light.

7. The system of claim 1, wherein the illumination system comprises a cylindrical lens that expands the first incident beam of light.

8. The system of claim 1, wherein the plasma-forming particles of the first size comprise atomic-size particles in the process chamber.

9. The system of claim 8, wherein the processing device is further to:

determine, using the density of the plasma-forming particles of the first size, a uniformity of the plasma in the process chamber.

10. The system of claim 1, wherein the light detector is to collect the scattered light from a plurality of depths within the illuminated region, wherein to collect the scattered light from the plurality of depths, the light detector is to:

change a focus to each depth of the plurality of depths, wherein to change the focus, the light detector is to change at least one of:

a focal distance of the light detector, or a distance from a lens of the light detector to the illuminated region.

11. A system comprising:

a process chamber;

one or more light sources to generate:

a first incident beam of light, wherein the first incident beam of light illuminates a region of the process chamber, and a second incident beam of light, wherein the second incident beam of light improves uniformity of illumination of at least a part of the illuminated region of the process chamber compared with uniformity of illumination of the part of the illuminated region of the process chamber by the first incident beam of light, the first incident beam of light having intensity that decreases along a direction within the region of the process chamber and the second incident beam of light having intensity that increases along the direction within the region of the process chamber;

a light detector to:

collect light scattering data characterizing scattered light produced by one or more particles, individual particles being illuminated simultaneously by both the first incident beam of light and the second incident beam of light; and a processing device communicatively coupled to the light detector, the processing device to:

determine, based on the light scattering data, a distribution of the one or more particles in the process chamber.

12. A method comprising:

illuminating, using a first incident beam of light, a region of a process chamber;

obtaining scattering data comprising an intensity map of scattered light for at least a portion of the illuminated region, the scattered light produced upon interaction of the first incident beam of light with particles in the illuminated region, wherein the intensity map comprises a background portion and a plurality of maxima;

determining, using the background portion of the intensity map, a density of plasma-forming particles of a first size in the illuminated region; and determining, using the plurality of maxima of the intensity map, a density of contaminant particles of a second size in the illuminated region.

13. The method of claim 12, further comprising:

illuminating the region of the process chamber using a second incident beam of light, wherein the second incident beam of light improves uniformity of illumination of at least a part of the illuminated region compared with uniformity of illumination of the part of the illuminated region by the first incident beam of light.

14. The method of claim 13, wherein the second incident beam of light enters the process chamber from a different direction compared with the first incident beam of light.

15. The method of claim 13, wherein the first incident beam of light is generated using a first light source, and the second incident beam of light is generated using a second light source.

16. The method of claim 13, wherein the first incident beam of light and the second incident beam of light are generated, using a beam splitter, from a common beam of light.

17. The method of claim 12, wherein the first incident beam of light is expanded using a cylindrical lens.

18. The method of claim 12, wherein the plasma-forming particles of the first size comprise atomic-size particles in the process chamber.

19. The method of claim 18, further comprising:

determining, using the density of the plasma-forming particles of the first size, a uniformity of the plasma in the process chamber.

20. The method of claim 12, wherein obtaining the scattering data comprises:

changing a focus of a light detector to each depth of a plurality of depths of the illuminated region, wherein changing the focus of the light detector comprises changing at least one of:

a focal distance of the light detector, or a distance from a lens of the light detector to the illuminated region.

* * * * *